United States Patent
Zheng et al.

(10) Patent No.: US 10,026,867 B2
(45) Date of Patent: Jul. 17, 2018

(54) NITRIDE WHITE-LIGHT LIGHT-EMITTING DIODE

(71) Applicant: XIAMEN SANAN OPTOELECTRONICS TECHNOLOGY CO., LTD., Xiamen (CN)

(72) Inventors: Jinjian Zheng, Xiamen (CN); Huanrong Yang, Xiamen (CN); Feilin Xun, Xiamen (CN); Shutao Liao, Xiamen (CN); Zhijie Li, Xiamen (CN); Mingyue Wu, Xiamen (CN); Chilun Chou, Xiamen (CN); Feng Lin, Xiamen (CN); Shuiqing Li, Xiamen (CN); Junyong Kang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/687,458

(22) Filed: Aug. 26, 2017

(65) Prior Publication Data
US 2017/0373221 A1    Dec. 28, 2017

Related U.S. Application Data

(63) Continuation of application No. PCT/CN2016/097761, filed on Sep. 1, 2016.

(30) Foreign Application Priority Data

Oct. 23, 2015  (CN) .......................... 2015 1 0689197

(51) Int. Cl.
H01L 33/06 (2010.01)
H01L 33/08 (2010.01)
H01L 33/44 (2010.01)

(52) U.S. Cl.
CPC .............. *H01L 33/06* (2013.01); *H01L 33/08* (2013.01); *H01L 33/44* (2013.01)

(58) Field of Classification Search
CPC ......... H01L 33/06; H01L 33/08; H01L 33/44; H01L 27/15–27/156
See application file for complete search history.

(56) References Cited

U.S. PATENT DOCUMENTS

2006/0261361 A1* 11/2006 Shakuda ............... H01L 27/156
257/98

* cited by examiner

*Primary Examiner* — Tucker J Wright
(74) *Attorney, Agent, or Firm* — Syncoda LLC; Feng Ma; Junjie Feng

(57) ABSTRACT

A nitride white-light LED includes: a substrate; an epitaxial layer; an N-type electrode and a P-type electrode; channels are formed on the substrate and the epitaxial layer; temperature isolation layers are formed with low thermal conductivity material thereon to form three independent temperature zones (Zones I/II/III) on a single chip; temperature control layers are formed with high thermal conductivity material on the side wall of the epitaxial layer and the back surface of the substrate at Zones I/II/III, and control temperature of the epitaxial layer and the substrate; based on different thermal expansion coefficients, lattice constants of the nitride and the substrate at Zones I/II/III are regulated to adjust the biaxial stress to which the nitride; quantum wells change conduction band bottom and valence band top positions to change forbidden band widths and light-emitting wavelengths; the LED can emit red, green and blue lights by a single chip.

20 Claims, 4 Drawing Sheets

NITRIDE WHITE-LIGHT LIGHT-EMITTING DIODE

The present application is a continuation of, and claims priority to, PCT/CN2016/097761 filed on Sep. 1, 2016, which claims priority to Chinese Patent Application No. 201510689197.9 filed on Oct. 23, 2015. The disclosures of these applications are hereby incorporated by reference in their entirety.

BACKGROUND

Currently, the light-emitting diode (LED), in particular, the nitride light-emitting diode is widely applied in the common lighting field due to its high light emitting efficiency. Arousing the phosphor powder with the blue light or ultraviolet chip is a general method for the nitride white-light light-emitting diode to emit white light, yet the color-rendering factor is low; and the method of using red-green-blue (RGB) integrating chip generally requires 3 chips for integrating encapsulation, resulting in high encapsulating difficulty and cost, poor stability and large size of the encapsulated device.

Given the problems of the nitride white-light light-emitting diode of the prior art that restrict its commercial application, it is necessary to introduce a new nitride white-light light-emitting diode.

SUMMARY

To solve the aforementioned technical problems, the present disclosure is to: provide a nitride white-light light-emitting diode by fabricating three independent temperature zones on a single chip and controlling temperatures thereof. Therefore, the substrate and the nitride would produce different lattice constants so that multi-quantum wells of the nitride light-emitting diode at three independent temperature zones are subject to different biaxial stress. Furthermore, positions of the conduction band bottom and the valence band top of the nitride quantum well in same In component are changed to form different forbidden band widths and light-emitting wavelengths. As a result, a single chip can emit white light by mixing red, green and blue lights.

In an aspect, a nitride white-light light-emitting diode is provided, including: a substrate; an epitaxial layer including an N-type nitride, a quantum well and a P-type nitride; an N-type electrode and a P-type electrode; form channels on the substrate and the epitaxial layer respectively and form temperature isolation layers with low thermal conductivity material thereon to form three independent temperature zones (Zones I/II/III) on the single chip; form temperature control layers with high thermal conductivity material on the side wall of the epitaxial layer and the back surface of the substrate at Zones I/II/III, which control temperature of the epitaxial layer and the substrate respectively; based on difference in thermal expansion coefficient, regulate lattice constants of the nitride and the substrate at Zones I/II/III, and adjust the biaxial stress to which the nitride subject; the quantum well, under different biaxial stress, will change positions of the conduction band bottom and the valence band top to change forbidden band widths and light-emitting wavelengths; by controlling biaxial stress, the light-emitting diode of same In component can emit red, green and blue lights to achieve white light emitting by a single chip.

In some embodiments, the substrate is SiC, Si, GaN, AlN or ZnO.

In some embodiments, the quantum well material is $In_xGa_{1-x}N/GaN$, where, $0<x<1$, wherein, In component x of the single chip is same, and In components x of the quantum wells at the three independent temperature zones I/II/III are also same. Preferably, In component $x=0.15$-$0.25$.

In some embodiments, the channel formed on the substrate corresponds to the channel formed on the epitaxial layer in vertical direction.

In some embodiments, the channel formed on the substrate is 10 nm-100 μm wide, preferably 500 nm; and 100-650 μm deep, preferably 150 μm.

In some embodiments, the channel formed on the epitaxial layer is 10 nm-100 μm wide, preferably 500 nm; and 10 nm-5 μm deep, preferably 2 μm.

In some embodiments, the channel is formed by dry etching or wet etching or their combination.

In some embodiments, the temperature isolation layer with low thermal conductivity material and the temperature control layer with high thermal conductivity material are formed by dry coating or wet coating or their combination.

In some embodiments, the thermal conductivity of the temperature isolation layer material with low thermal conductivity is $<1$ W/(m·K).

In some embodiments, the thermal conductivity of the temperature control layer material with high thermal conductivity is $>100$ W/(m·K).

In another aspect, a light-emitting system including a plurality of nitride white-light light-emitting diodes is provided, in which each nitride white-light light-emitting diode includes a substrate; an epitaxial layer including an N-type nitride, a quantum well and a P-type nitride; an N-type electrode and a P-type electrode.

Figure 1:
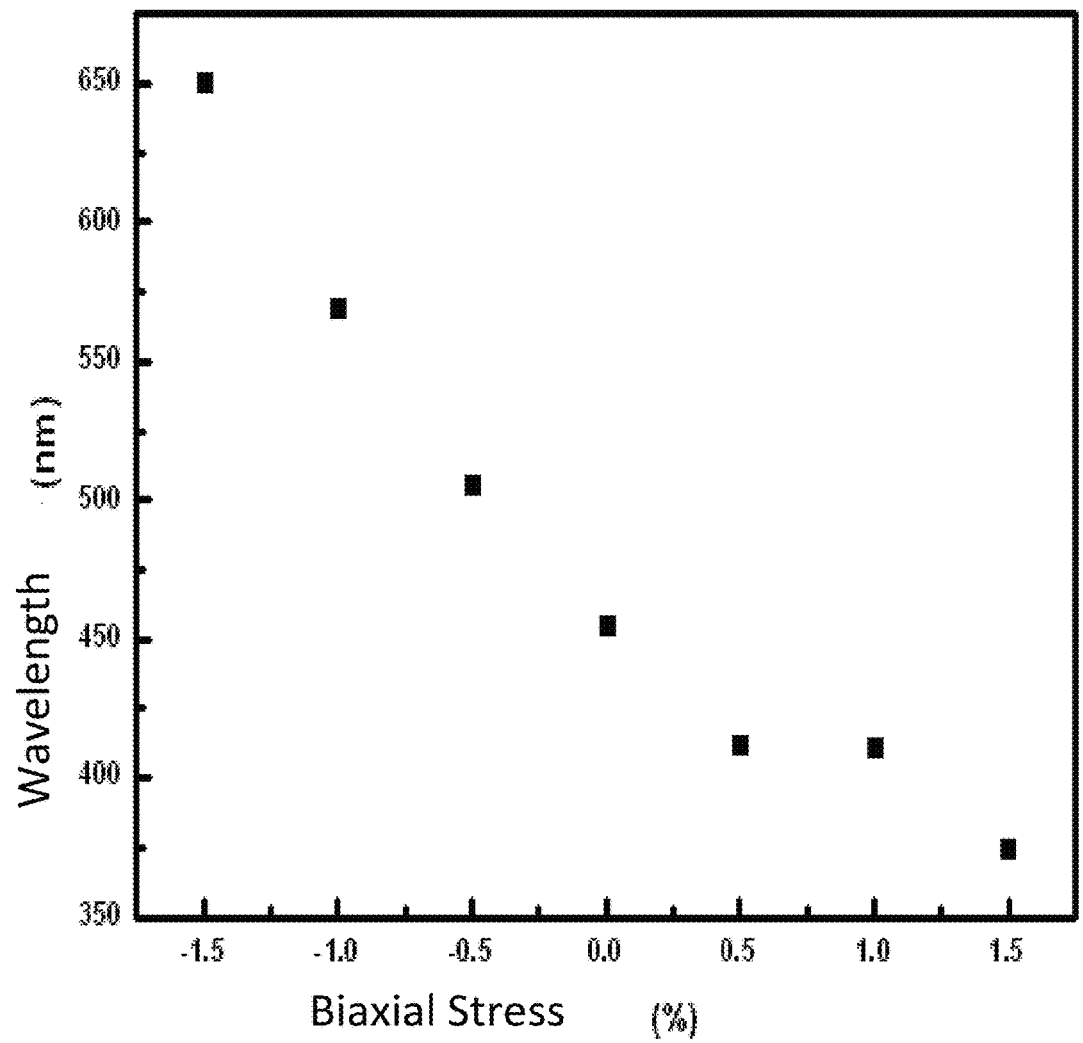
FIG. 1 illustrates a schematic diagram showing wavelength change of the multi-quantum well in same In component of a nitride white-light light-emitting diode under different stresses according to some embodiments.

In the drawings: 100: substrate; 101: N-type nitride; 102: N-type electrode; 103: multi-quantum well; 104: P-type nitride; 105: P-type electrode; 106a: temperature isolation layer with low thermal conductivity at nitride side; 106b: temperature isolation layer with low thermal conductivity at substrate side; 107a/b/c: temperature control layer with high thermal conductivity deposited on the nitride side wall at three temperature zones I/II/III; 108a/b/c: temperature control layer with high thermal conductivity deposited on the substrate side wall at three temperature zones I/II/III.

DETAILED DESCRIPTION

Detailed descriptions will be given for the present disclosure in combination with accompanying drawings and various embodiments to clearly represent related technical contents, characteristics and effects of present disclosure.

Various embodiments will be described in detail with reference to the accompanying drawings and examples.

FIG. 1 shows the principles of a nitride white-light light-emitting diode according to some embodiments disclosed herein. In the nitride light-emitting diode with same In component (x=0.15-0.25), under different biaxial stresses, positions of the $In_xGa_{1-x}N$/GaN conduction band bottom and the valence band top of the multi-quantum well will change, resulting in change of forbidden band widths. Therefore, a nitride light-emitting diode in same In component emits light from ultraviolet to infrared, thus realizing wavelength control of emitted light. Therefore, by controlling biaxial stress of the nitride light-emitting diode, the wavelength of emitted light is controlled so that a single chip can emit white light by mixing red, green and blue lights produced from different regions.

Figure 2:
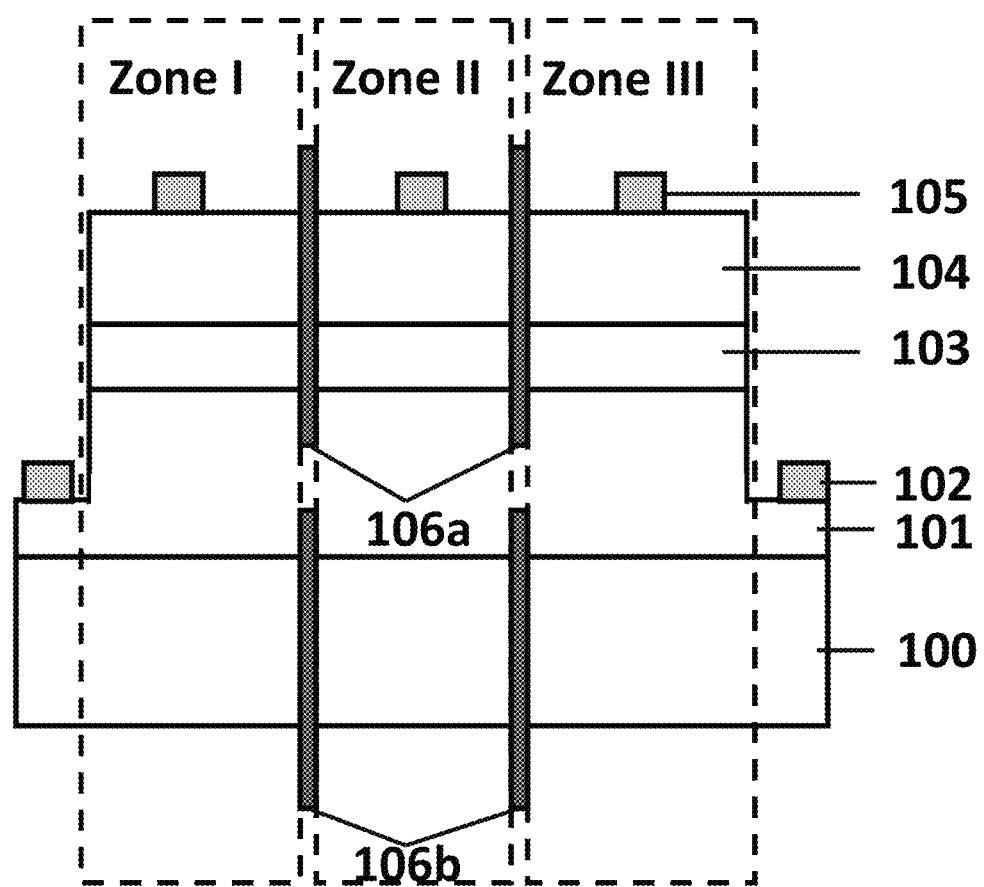
FIG. 2 illustrates a schematic diagram showing a nitride white-light light-emitting diode after channel etching and depositing of a temperature isolation layer with low thermal conductivity material according to some embodiments.

With reference to FIG. 2, to emit white light by mixing red, green and blue (RGB) lights by a single chip, first, form an epitaxial layer composed of an N-type nitride 101, a multi-quantum well 103 and a P-type nitride 104 on the substrate 100 via metal-organic chemical vapor deposition (MOCVD) with epitaxial growth; then, deposit a P-type electrode 105 and an N-type electrode 102 on the P-type nitride 104 and the N-type nitride 102 via photolithography. Then, etch 2 channels of 500 nm wide and 2 μm deep from top to bottom with dry etching from the P-type nitride of a single chip, and form temperature isolation layers 106a with low thermal conductivity material on the channels via dry coating, in which, the temperature isolation layer material, preferably asbestos or paraffin, has thermal conductivity <1 W/(m·K); thin the substrate 100 to 250 μm and polish; etch 2 channels of 500 nm wide and 150 μm deep from bottom to up from the substrate back surface, which correspond to the channels formed on the epitaxial layer in vertical direction; and deposit temperature isolation layers 106b with low thermal conductivity material on the channels with dry coating, wherein, the temperature isolation layer material, preferably asbestos or paraffin, has thermal conductivity <1 W/(m·K), thus forming three independent temperature zones (Zones I/II/III), for controlling temperatures of the nitride epitaxial layer and the substrate of each temperature zone of the single chip.

Figure 3:
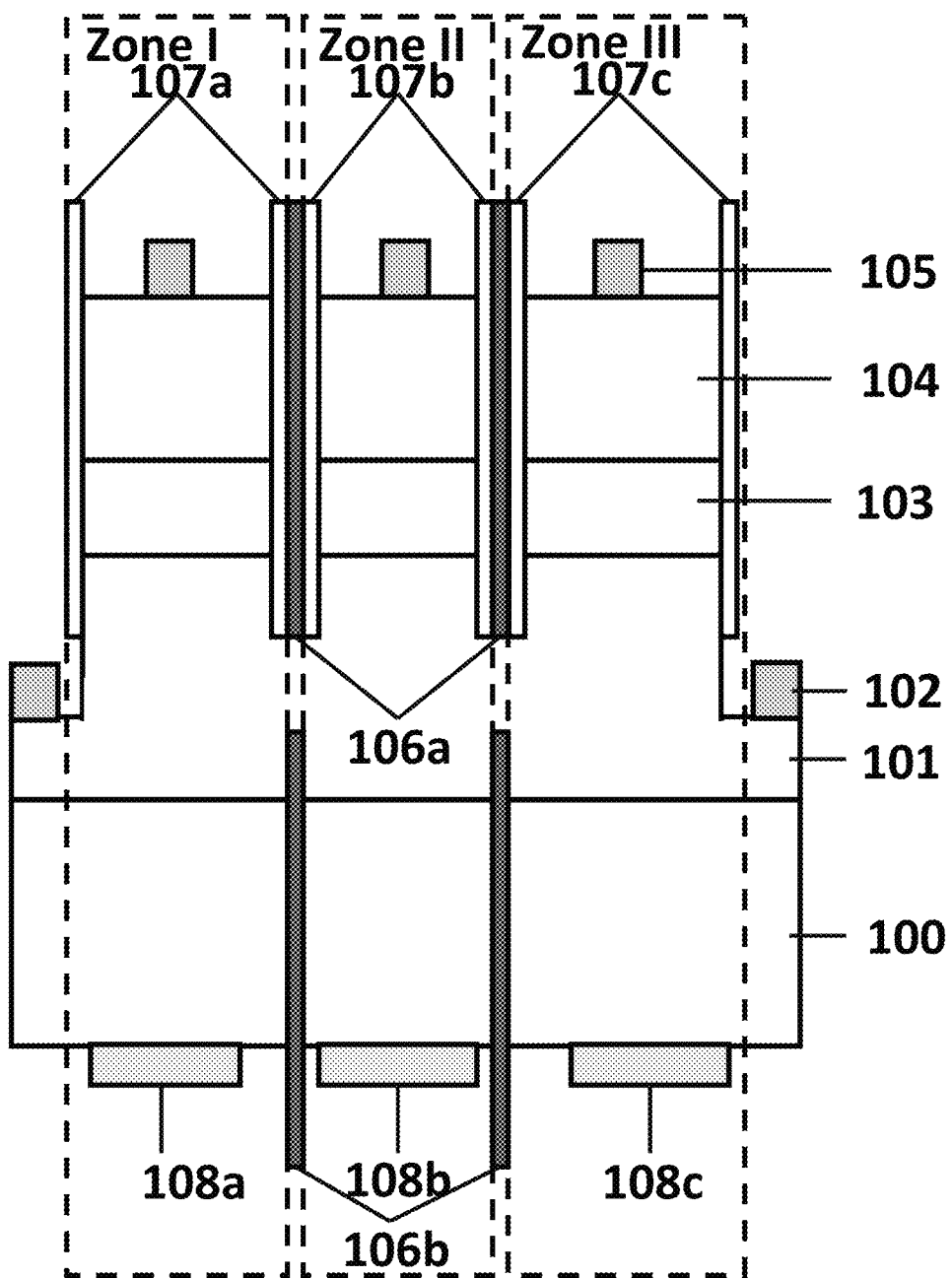
FIG. 3 illustrates a complete schematic diagram of a nitride white-light light-emitting diode according to an embodiment of the present disclosure.
Figure 4:
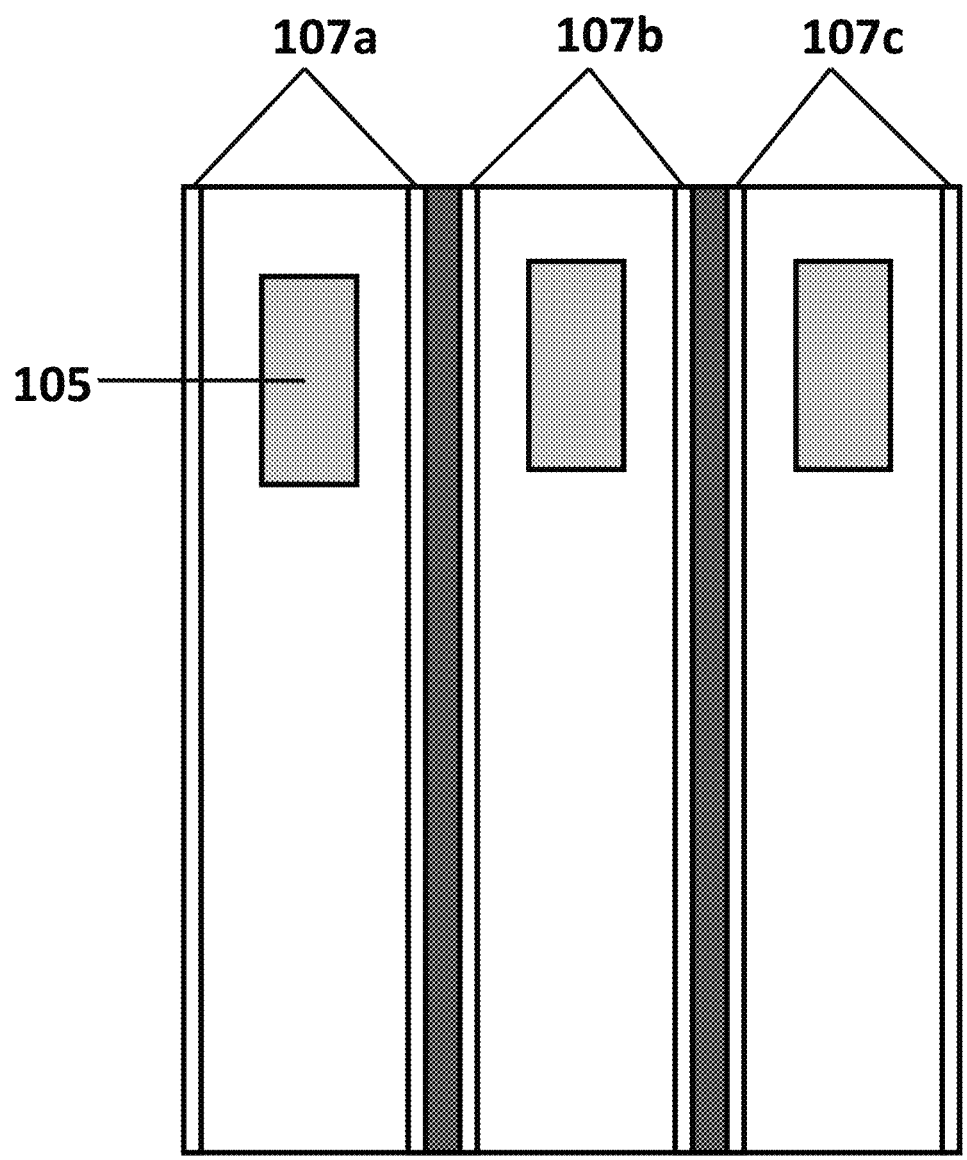
FIG. 4 illustrates a top view of FIG. 3.

Next, with reference to FIGS. 3 and 4, wet etch 4 channels of 500 nm wide and 2 μm deep beside the temperature isolation layer 106a of the nitride epitaxial layer via photolithography, and deposit temperature control layers 107a/b/c with high thermal conductivity at the 4 channels and the external side wall of the single chip via dry coating, wherein, material of the temperature control layers, preferably, Cu, Ag or SiC, has thermal conductivity >100 W/(m·K); meanwhile, deposit temperature control materials 108a/b/c with high thermal conductivity on the back surface of the substrate via wet coating. Therefore, temperature of the nitride and the substrate at I/II/III temperature zones are controlled by the material of the temperature control layers, thus precisely controlling lattice constants of the nitride and the substrate at the three independent temperature zones based on thermal expansion coefficient. Moreover, by controlling stress to which the nitride quantum well subject, forbidden band widths and light-emitting wavelengths are changed. In this way, a single nitride chip in same In component can emit red, green and blue lights to achieve white light emitting by a single chip. For instance, a green-light epitaxial wafer with light-emitting wavelength of 455 nm is used to control the temperature control materials 107b/108b, where temperature of the nitride at Zone II is lowered, and temperature of the sapphire substrate at Zone II is arisen, so that the nitride is subject to tensile stress that offsets the original stress, making the stress it subject to 0%. In this way, the green-light chip emits green light; meanwhile, control the temperature control materials 107a/108 and 107c/108c, where temperature of the nitride at Zone I is arisen, and temperature of the substrate at Zone I is lowered, so that the nitride at Zone I is subject to rising press stress. In this way, the band gap emits red light; and temperature of the nitride at Zone III is lowered and temperature of the substrate at Zone III is arisen, so that the nitride is subject to rising tensile stress, and finally the nitride at Zone III is subject to press stress. In this way, the band gap emits blue light. Therefore, a green-light epitaxial wafer in same component can emit red, green and blue lights via temperature control, thus emitting white light.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride white-light light-emitting diode (LED), comprising:
    a substrate;
    an epitaxial layer, including
        an N-type nitride;
        a quantum well; and
        a P-type nitride;
    an N-type electrode;
    a P-type electrode;
    channels at the substrate and the epitaxial layer;
    temperature isolation layers with low thermal conductivity material over the channels to form three independent temperature zones (Zones I/II/III);
    temperature control layers with high thermal conductivity material over a side wall of the epitaxial layer and a back surface of the substrate at the Zones I/II/III;
    wherein:
        the temperature control layers are configured to control temperature of the epitaxial layer and the substrate, based on difference in thermal expansion coefficients, thereby adjusting lattice constants of the N-type and/or P-type nitride and the substrate at the Zones I/II/III, and adjusting biaxial stress to which the N-type and/or P-type nitride subject;
        the quantum well, under different biaxial stress, is configured to change conduction band bottom and valence band top positions to change forbidden band widths and light-emitting wavelengths; and
        by controlling biaxial stress, the LED with a same In component is configured to emit red, green and blue lights to achieve white light emitting with a single chip.

2. The LED of claim 1, wherein: the substrate is SiC, Si, GaN, AlN, or ZnO.

3. The LED of claim 1, wherein:
    the quantum well comprises $In_xGa_{1-x}N$/GaN, and has a same In composition at the three independent temperature zones of the single chip.

4. The LED of claim 1, wherein: the channels formed at the substrate correspond to the channels formed at the epitaxial layer in vertical direction.

5. The LED of claim 1, wherein: the channels formed at the substrate is 10 nm-100 μm wide, and 100-650 μm deep.

6. The LED of claim 1, wherein: the channels formed at the epitaxial layer are 10 nm-100 μm wide, and 10 nm-5 μm deep.

7. The LED of claim 4, wherein: the channels are formed by dry etching or wet etching or their combination.

8. The LED of claim 1, wherein: the temperature isolation layer with low thermal conductivity material and the temperature control layer with high thermal conductivity material are formed by dry coating or wet coating or their combination.

9. The LED of claim 1, wherein: thermal conductivity of the temperature isolation layer material with low thermal conductivity is <1 W/(m·K).

10. The LED of claim 1, wherein: thermal conductivity of the temperature control layer material with high thermal conductivity is >100 W/(m·K).

11. A light-emitting system comprising a plurality of nitride white-light light-emitting diodes (LEDs), each LED including:
   a substrate;
   an epitaxial layer, including
      an N-type nitride;
      a quantum well; and
      a P-type nitride;
   an N-type electrode;
   a P-type electrode;
   channels at the substrate and the epitaxial layer;
   temperature isolation layers with low thermal conductivity material over the channels to form three independent temperature zones (Zones I/II/III);
   temperature control layers with high thermal conductivity material over a side wall of the epitaxial layer and a back surface of the substrate at the Zones I/II/III;
   wherein:
      the temperature control layers are configured to control temperature of the epitaxial layer and the substrate, based on difference in thermal expansion coefficients, thereby adjusting lattice constants of the N-type and/or P-type nitride and the substrate at the Zones I/II/III, and adjusting biaxial stress to which the N-type and/or P-type nitride subject;
      the quantum well, under different biaxial stress, is configured to change conduction band bottom and valence band top positions to change forbidden band widths and light-emitting wavelengths; and
      by controlling biaxial stress, the LED with a same In component is configured to emit red, green and blue lights to achieve white light emitting with a single chip.

12. The system of claim 11, wherein: the substrate is SiC, Si, GaN, AlN, or ZnO.

13. The system of claim 11, wherein: the quantum well material is $In_xGa_{1-x}N/GaN$, where, $0<x<1$, wherein, the In components of the quantum wells at the three independent temperature zones of the single chip are same.

14. The system of claim 11, wherein: the thermal conductivity of the temperature isolation layer material with low thermal conductivity is <1 W/(m·K); and the thermal conductivity of the temperature control layer material with high thermal conductivity is >100 W/(m·K).

15. The system of claim 11, wherein: the channels formed at the substrate is 10 nm-100 μm wide, and 100-650 μm deep.

16. The system of claim 11, wherein: the channels formed at the epitaxial layer are 10 nm-100 μm wide, and 10 nm-5 μm deep.

17. The system of claim 11, wherein: the channels are formed by dry etching or wet etching or their combination.

18. The system of claim 11, wherein: the temperature isolation layer with low thermal conductivity material and the temperature control layer with high thermal conductivity material are formed by dry coating or wet coating or their combination.

19. The system of claim 11, wherein: thermal conductivity of the temperature isolation layer material with low thermal conductivity is <1 W/(m·K).

20. The system of claim 11, wherein: thermal conductivity of the temperature control layer material with high thermal conductivity is >100 W/(m·K).

* * * * *